United States Patent
Irish et al.

(10) Patent No.: US 12,081,032 B2
(45) Date of Patent: Sep. 3, 2024

(54) SYSTEM FOR BALANCING AND CONVERTING VOLTAGE OUTPUT FOR PHOTOVOLTAIC MODULES

(71) Applicant: Optivolt Labs, Inc., Burlingame, CA (US)

(72) Inventors: Linda Stacey Irish, Burlingame, CA (US); Sierra Rae King, Burlingame, CA (US)

(73) Assignee: Optivolt Labs, Inc., San Francisco, CA (US)

( * ) Notice: Subject to any disclaimer, the term of this patent is extended or adjusted under 35 U.S.C. 154(b) by 0 days.

(21) Appl. No.: 18/371,209

(22) Filed: Sep. 21, 2023

(65) Prior Publication Data
US 2024/0088671 A1    Mar. 14, 2024

Related U.S. Application Data

(63) Continuation-in-part of application No. 18/211,974, filed on Jun. 20, 2023, which is a continuation of application No. 17/484,615, filed on Sep. 24, 2021, now Pat. No. 11,728,656.

(60) Provisional application No. 63/441,989, filed on Jan. 30, 2023, provisional application No. 63/408,735, filed on Sep. 21, 2022, provisional application No. 63/083,817, filed on Sep. 25, 2020.

(51) Int. Cl.
| | |
|---|---|
| H02J 3/38 | (2006.01) |
| G01R 19/165 | (2006.01) |
| G05F 1/67 | (2006.01) |
| H02J 3/26 | (2006.01) |
| H02J 7/00 | (2006.01) |
| H02S 40/34 | (2014.01) |
| H02S 40/36 | (2014.01) |

(52) U.S. Cl.
CPC ........ *H02J 3/381* (2013.01); *G01R 19/16538* (2013.01); *G05F 1/67* (2013.01); *H02J 3/26* (2013.01); *H02J 7/0016* (2013.01); *H02S 40/34* (2014.12); *H02S 40/36* (2014.12); *H02J 2300/26* (2020.01)

(58) Field of Classification Search
CPC .. H02J 3/26; H02J 3/381; H02J 7/0016; H02J 2300/26; H02S 40/34; H02S 40/36; G01R 19/16538; G05F 1/67
USPC ......................................................... 307/78
See application file for complete search history.

(56) References Cited

U.S. PATENT DOCUMENTS

2017/0366018 A1*  12/2017  Von Novak ........... H02J 7/0016

* cited by examiner

*Primary Examiner* — Hal Kaplan
(74) *Attorney, Agent, or Firm* — Run8 Patent Group, LLC; Peter Miller; Alexander Rodriguez

(57) ABSTRACT

A system for balancing and converting voltage output from photovoltaic modules includes a set of solar substrings, a power conversion circuit, and a controller. The power conversion circuit includes: a set of windings coupled in series and arranged in parallel to the set of solar substrings; a set of switches coupled in parallel and interposed between the set of solar substrings and the set of windings; and an output switch coupled in series to a first switch, in the set of switches, and an output capacitor. The controller is configured to: oscillate states of the set of switches and the output switch at a first duty cycle; balance voltages output from the set of solar substrings across the set of windings to a nominal output voltage; and modify the nominal output voltage to a target voltage directed to the target load based on the first duty cycle.

20 Claims, 7 Drawing Sheets

SYSTEM FOR BALANCING AND CONVERTING VOLTAGE OUTPUT FOR PHOTOVOLTAIC MODULES

CROSS-REFERENCE TO RELATED APPLICATIONS

This application claims the benefit of U.S. Provisional Application Nos. 63/408,735, filed on 21 Sep. 2022, and 63/441,989, filed on 30 Jan. 2023, each of which is hereby incorporated in its entirety by this reference.

This application is a continuation-in-part of U.S. patent application Ser. No. 18/211,974, filed on 20 Jun. 2023, which is a continuation application of U.S. patent application Ser. No. 17/484,615, filed on 24 Sep. 2021, which claims the benefit of U.S. Provisional Application No. 63/083,817, filed on 25 Sep. 2020, each of which is incorporated in its entirety by this reference.

TECHNICAL FIELD

This invention relates generally to the field of photovoltaic modules and more specifically to a new and useful method for balancing and converting voltage output in the field of photovoltaic modules.

DESCRIPTION OF THE EMBODIMENTS

The following description of embodiments of the invention is not intended to limit the invention to these embodiments but rather to enable a person skilled in the art to make and use this invention. Variations, configurations, implementations, example implementations, and examples described herein are optional and are not exclusive to the variations, configurations, implementations, example implementations, and examples they describe. The invention described herein can include any and all permutations of these variations, configurations, implementations, example implementations, and examples.

1. System

Figure 1:
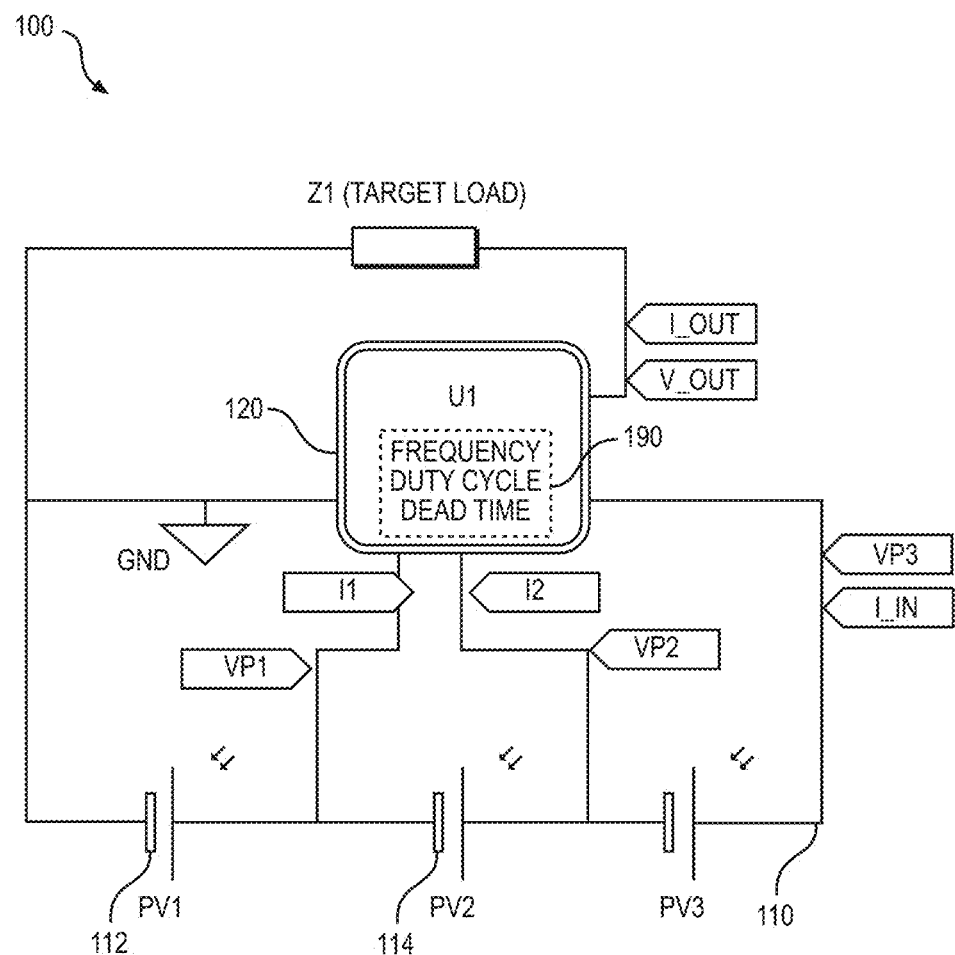
FIG. 1 is a schematic representation of the system.
Figure 2:
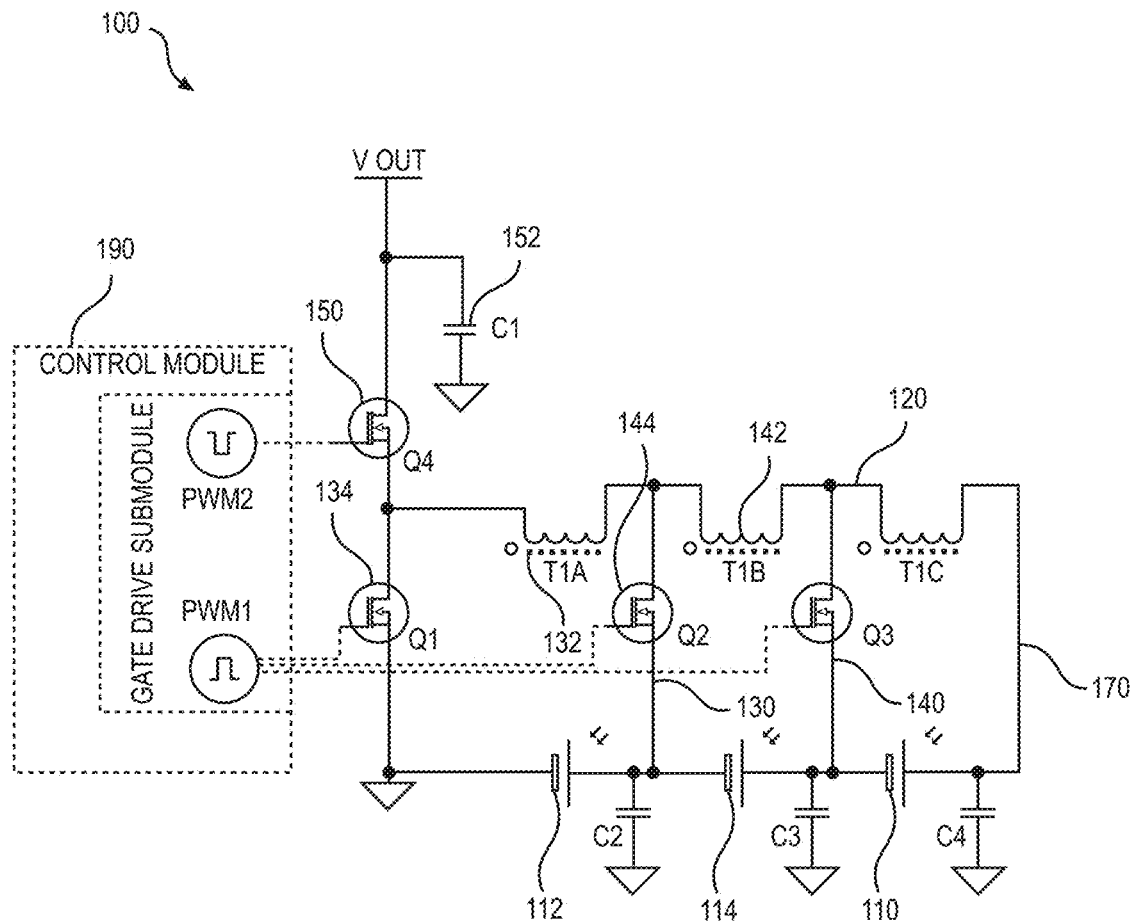
FIG. 2 is a schematic representation of one variation of the system.
Figure 3:
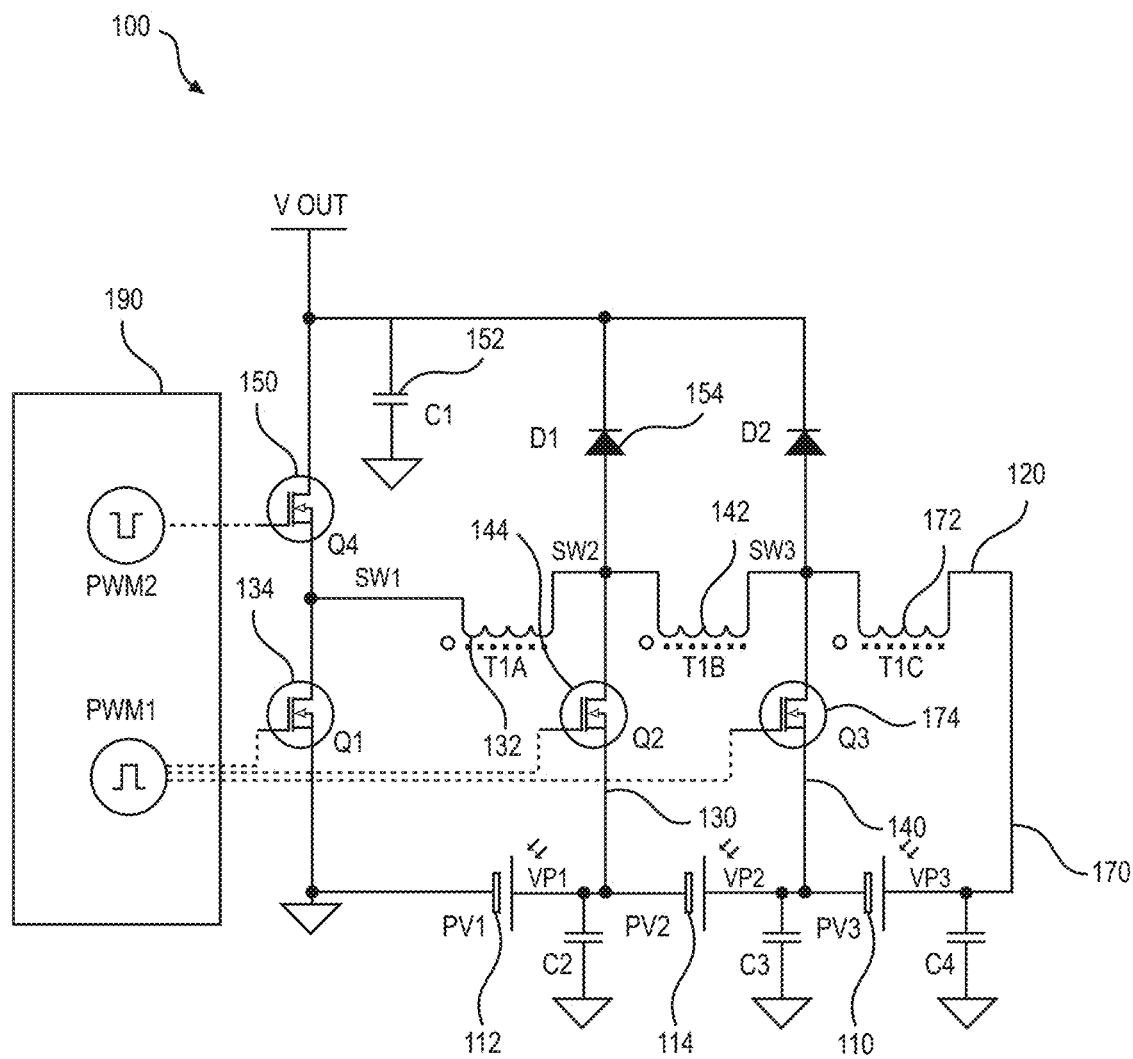
FIG. 3 is a schematic representation of one variation of the system.

As shown, in FIGS. 1 and 2, a system 100 for balancing and converting voltage output from photovoltaic modules includes: a first set of solar substrings 110; a power conversion circuit 120; and a controller 190.

The first set of solar substrings no includes a first solar substring 112 and a second solar substring 114 connected in series.

The power conversion circuit 120 includes: a first power level segment 130; a second power level segment 140; and an output power level segment. The first power level segment 130 includes: a first winding 132 arranged in parallel to the first solar substring 112; and a first switch 134 arranged between the first winding 132 and the first solar substring 112. The second power level segment 140 includes: a second winding 142 connected in series with the first winding 132 and arranged in parallel to the second solar substring 114; and a second switch 144 arranged in parallel to the first switch 134 between the second winding 142 and the second solar substring 114. The output power level segment includes: an output switch 150 arranged in series with the first switch 134; and an output capacitor 152 connected to the output switch 150 and configured to couple to a target load.

The controller 190 is configured to trigger a voltage modification cycle to alternate operation of the power conversion circuit 120 between a charging state and a discharging state by: driving a first modulation signal to the first switch 134 and the second switch 144 at a first duty cycle; and driving a second modulation signal, inversely proportional to the first modulation signal, to the output switch 150.

The controller 190 is also configured to: balance voltages output from the first solar substring 112 and the second solar substring 114 across the first winding 132 and the second winding 142 to a nominal output voltage; and modify the nominal output voltage to a target voltage directed to the target load based on the first duty cycle.

1.1. Variation: Tri-Power Level Segment Converter

Figure 4:
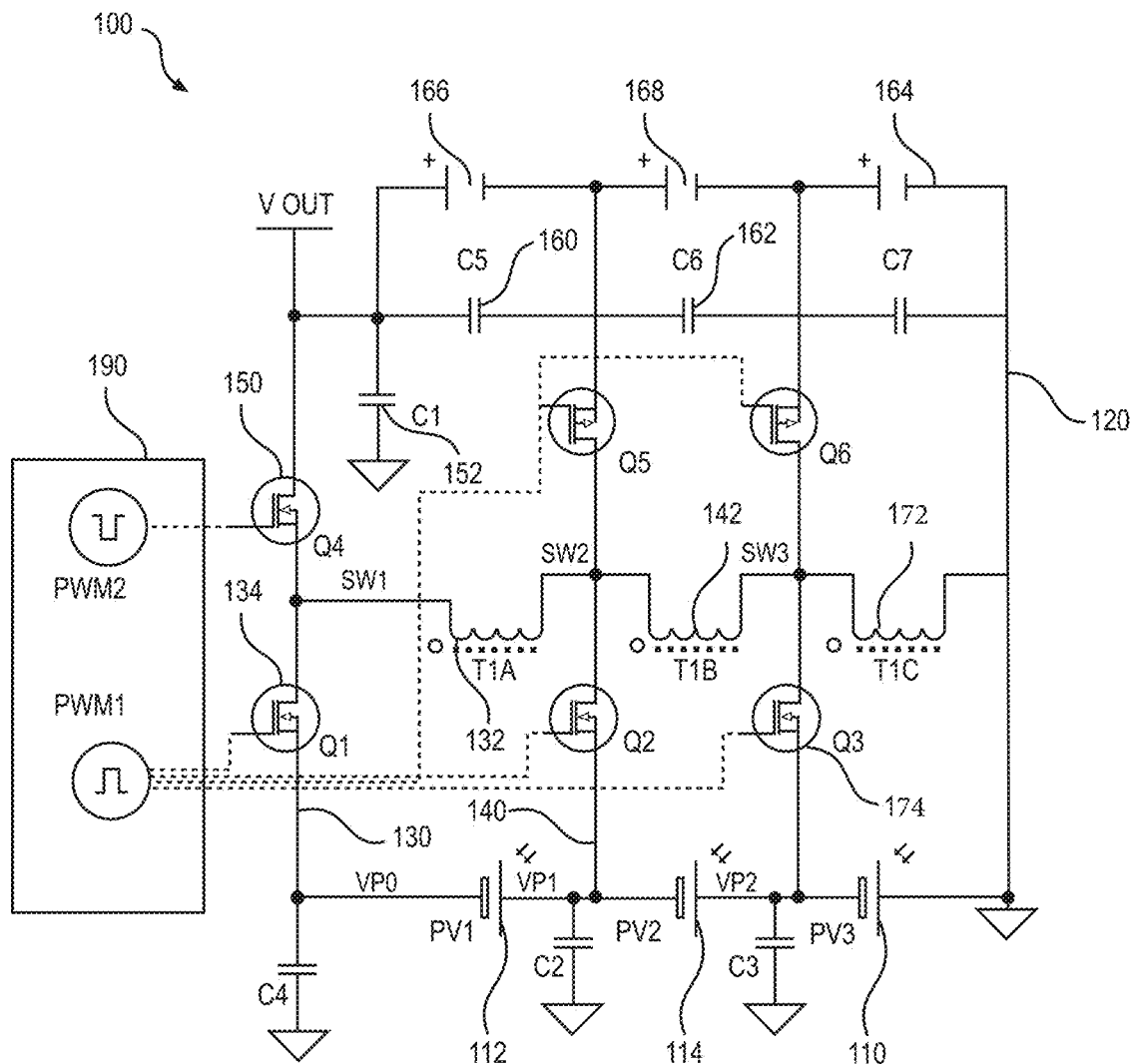
FIG. 4 is a schematic representation of one variation of the system.
Figure 5:
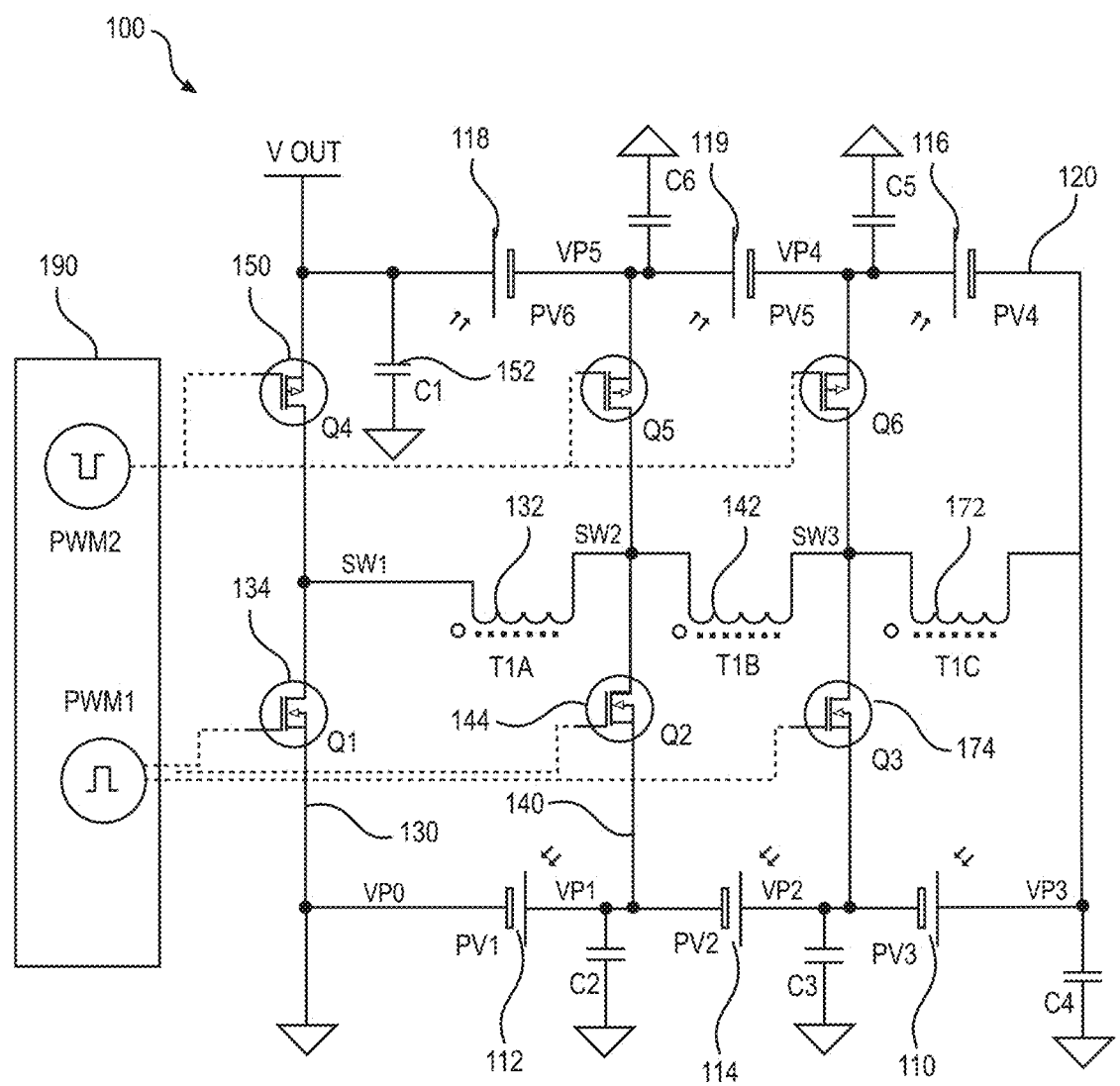
FIG. 5 is a schematic representation of one variation of the system.
Figure 6:
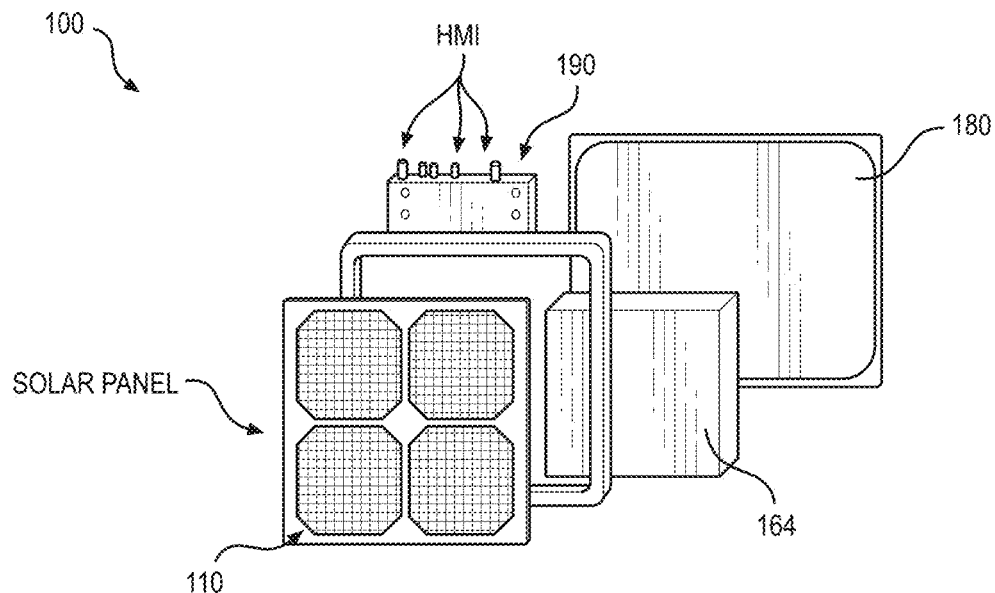
FIG. 6 is a schematic representation of one variation of the system.
Figure 7:
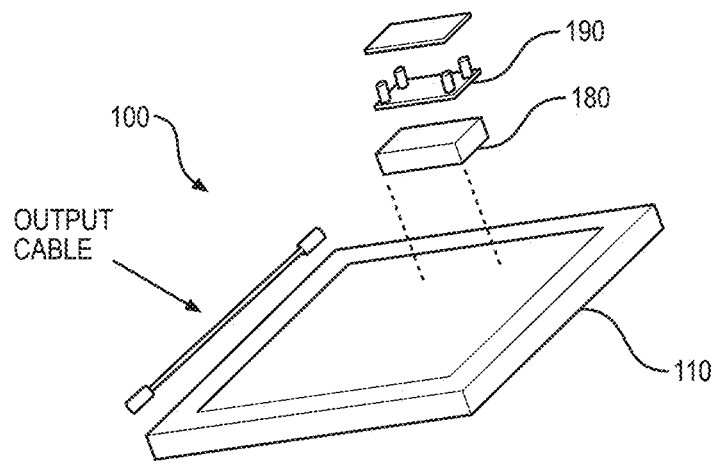
FIG. 7 is a schematic representation of one variation of the system.
Figure 8:
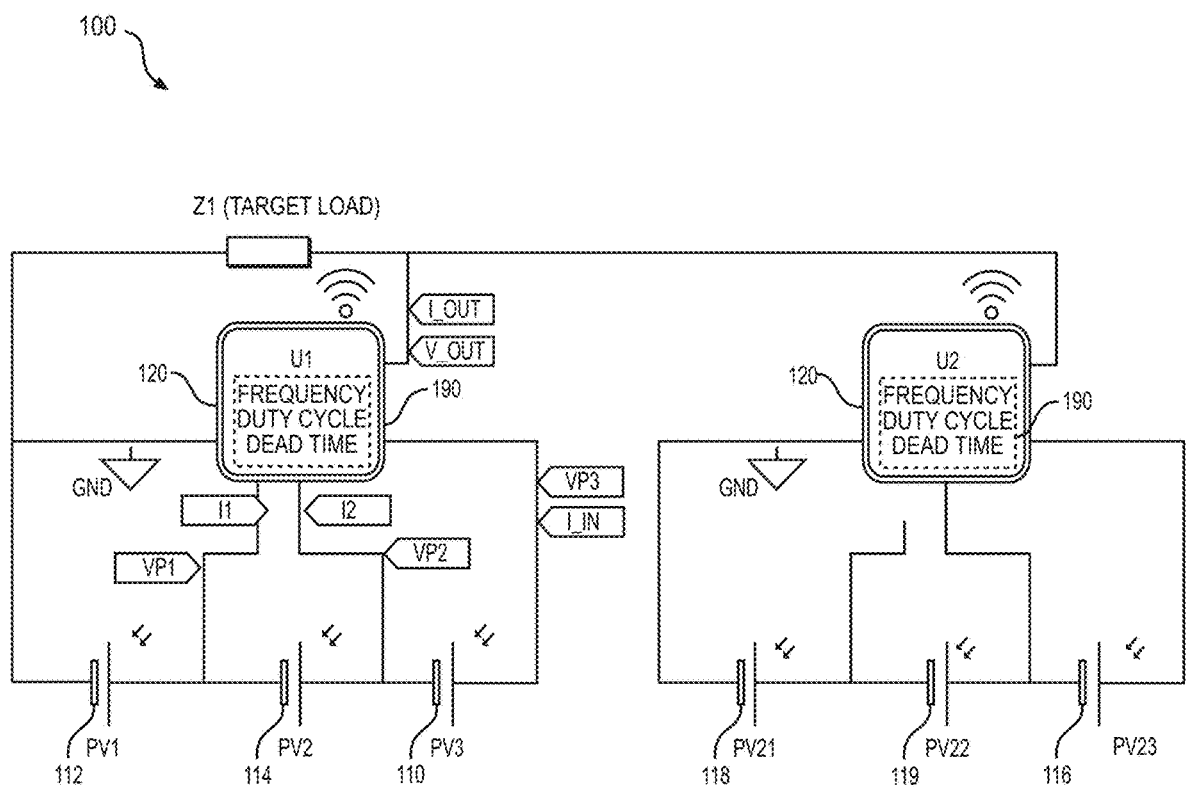
FIG. 8 is a schematic representation of one variation of the system.

As shown in FIGS. 1 and 4, a system 100 for balancing and converting voltage output for photovoltaic modules includes: a solar panel; a power conversion circuit 120 connected to the solar panel; and a controller 190.

The solar panel includes a first series of solar substrings arranged in series and including: a first solar substring 112; a second solar substring 14; and a third solar substring 118.

The power conversion circuit 120 includes a first power level segment 130 including: a first winding 132; a first switch 134; and a first capacitor 160. The first winding 132 is arranged in parallel to the first solar substring 112. The first switch 134: is arranged between the first winding 132 and the first solar substring 112; is connected to the first solar substring 112 to define a first junction; and is connected to the first winding 132 to define a second junction. The first capacitor 160 is connected to the first solar substring 112 to define a third junction.

The power conversion circuit 120 also includes a second power level segment 140 including: a second winding 142; a second switch 144; and a second capacitor 162. The second winding 142: is connected in series with the first winding 132 to define a fourth junction; and arranged in parallel to the second solar substring 114. The second switch 144: is arranged in parallel to the first switch 134 between the second winding 142 and the second solar substring 14; and connected to the third junction and the fourth junction. The second capacitor 162 is connected to the second solar substring 114 to define a fifth junction.

The power conversion circuit 120 further includes a third power level segment 170 including: a third winding 172; a third switch 174; and a third capacitor. The third winding 172: is connected in series with the second winding 142 to define a sixth junction; and is arranged in parallel to the third solar substring 118. The third switch 174: is arranged in parallel to the second switch 144 between the third winding 172 and the third solar substring 118; and is connected to the fifth junction and the sixth junction. The third capacitor is connected to the third solar substring 118 to define a seventh junction.

The power conversion circuit 120 further includes a fourth power level segment including: an output switch 150; and an output capacitor 152. The output switch 150: is arranged in series with the first switch 134; and is connected to the second junction. The output capacitor 152 is connected to the fourth switch and defines an eighth junction.

The controller 190 is configured to: drive a first modulation signal to the first switch 134, the second switch 144, and the third switch 174 at a first duty cycle; drive a second modulation signal, inversely proportional to the first modulation signal, to the output switch 150; balance voltages across the first power level segment 130, the second power level segment 140; and generate an output voltage greater than a nominal output voltage across the third solar substring 118.

2. Applications

Generally, the system 100 functions: as a voltage-balancing circuit to balance voltages across a series of solar substrings within a solar panel; and as a voltage converter circuit to modify (e.g., increase, attenuate) voltage output from the first set of solar substrings 110. Once the solar panel is deployed, environmental conditions—such as position of clouds, position of the Sun, local fog conditions, etc.—may yield non-uniform illuminance of each solar substring in the solar panel, which in turn may decrease a nominal output voltage of the first set of solar substrings 110 in the solar panel. Therefore, the system 100 can: balance voltages across each solar substring in the first set of solar substrings 110; and maintain a target output voltage regardless of the environmental conditions affecting illumination of the first set of solar substrings 110.

In one example of the system 100 arranged in a boost configuration, the system 100 includes: a series of solar substrings; a series of windings (e.g., inductor, windings of a transformer) arranged in parallel to the first set of solar substrings 110; and a first set of switches (e.g., transistor) arranged between the first set of solar substrings 110 and the series of windings. In this example, the system 100 further includes: an output switch arranged in series to a first switch 134—in the first set of switches—and connected to a target load; and an output capacitor 152 connected to the output switch 150 and configured to store electric potential energy generated from the series of windings. Furthermore, in this example, the system 100 includes a controller 190: connected to the first set of switches and the output switch 150; and configured to generate a first modulation signal for the first set of switches and a second modulation signal—inversely proportional to the first modulation signal—for the output switch 150. Thus, the system 100 operates by alternating between: a first state in which the first set of switches are closed and the output switch 150 is open; and a second state in which the first set of switches are open and the output switch 150 is closed.

In this example, during operation of the system 100 in the first state, the system 100 directs current from the first set of solar substrings 110 through the series of windings thereby: balancing voltages across the first set of solar substrings 110; and storing energy from the first set of solar substrings 110 in magnetic fields formed at the series of windings. Subsequently, in the second state, the system 100: transfers energy accumulated in the series of windings toward the output capacitor 152; and generates a gained output voltage defined by the ratio between time duration of the system 100 in the first state and time duration of the system 100 in the second state. Thus, during environmental conditions resulting in non-uniform illumination across the first set of solar substrings 110, the system 100 can implement maximum power point tracking (or "MPPT") techniques to: modify the duty cycle of the first modulation signal and the second modulation signal; and maintain a target output voltage to a target load during operation of the system 100.

Additionally or alternatively, the system 100: can be arranged in a buck configuration to decrease nominal output voltage from the first set of solar substrings 110; and can be arranged in a buck/boost configuration to increase and attenuate output voltage from the first set of solar substrings 110 in order to maintain a target output voltage. Furthermore, the system 100 can include additional switches and/or diodes connected to the series of windings and the output capacitor 152 in order to minimize leakage inductance resulting from the driving and releasing of the series of windings.

Therefore, the system 100 can: balance voltage output across the first set of solar substrings no regardless of environmental conditions; modify (e.g., increase, attenuate) nominal voltage output from the first set of solar substrings 110; and maintain a target voltage output to a target voltage during operation of the system 100.

3. Photovoltaic Modules

Generally, the system 100 can include (or couple to, interface with) a set of photovoltaic modules, each including: a solar panel containing a series of solar substrings; and a power conversion circuit 120 connected to the first set of solar substrings 110 and a target load (e.g., mobile device, a robotic system 100). Furthermore, the system 100 can include: a controller 190 mounted directly to the power conversion circuit 120; and a controller 190 interface (e.g., HDMI) to connect the controller 190 to an external device (e.g., mobile computing device).

In one implementation, the system 100 includes a chassis 180 containing: the power conversion circuit 120 arranged on a PCBA; a battery connected to the power conversion circuit 120; a controller 190 configured to implement MPPT techniques; and a controller 190 interface connected to the controller 190. In this implementation, the system 100 includes the chassis 180: mounted to a rear end of the solar panel; and connected to the first set of solar substrings 110 on the solar panel. Thus, the system 100 can regulate (e.g., increase and/or attenuate) DC voltage output from the first set of solar substrings no to maintain a target voltage output.

In another implementation, the system 100 includes a chassis 180 containing the power conversion circuit 120: arranged on the PCBA; and connected to a set of series of solar substrings arranged on the solar panel. In this implementation, voltage output generated by the first set of solar substrings no in the solar panel enables continuous operation of the power conversion circuit 120.

In another implementation, the system 100 can further include each photovoltaic module—in the set of photovoltaic modules—connected to each other (e.g., in series, in parallel) in order to regulate power voltage delivered to the target load connected to the set of photovoltaic modules. In one example, the system 100 includes each photovoltaic module—in the set of photovoltaic modules—including a wireless communication module (e.g., Bluetooth, WIFI). Thus, the system 100 can implement MPPT techniques across the set of photovoltaic modules to generate and maintain a target output voltage to the target load.

4. Power Conversion Circuit

Generally, the system 100 can be arranged in varying configurations in order to modify (e.g., increase, attenuate) voltage output from the first set of solar substrings 110 and maintain a target voltage output to a target load. In particular, the system 100 can be arranged in: a boost configuration in order to increase nominal output voltage from the first set of solar substrings 110; a buck configuration to decrease nominal output voltage from the first set of solar substrings 110; and a buck/boost configuration to increase and decrease nominal output voltage from the first set of solar substrings no.

Furthermore, the system 100 can include a set of diodes and/or a second set of switches connected to the series of windings to reduce leakage inductance during operation of the system 100.

4.1 Boost Configuration

In one implementation, the system 100 is arranged in a boost configuration to: balance voltage output across the first set of solar substrings no; and increase the nominal voltage output from the first set of solar substrings 110. In this implementation, the system 100 includes: a first series of windings arranged in series; a first series of solar substrings arranged in series and connected in parallel to the first series of windings; and a first set of switches (e.g., transistors) arranged in parallel to each other and connecting the first series of windings to the first series of solar substrings. Additionally, the system 100 includes: an output switch 150 connected in series to a first switch 134 in the first set of switches; and an output capacitor 152 connected to the output switch 150.

During operation, the system 100 can: generate a first modulation signal configured to alternate the first set of switches between an open state and a closed state; and generate a second modulation signal—inversely proportional to the first modulation signal except during dead time—configured to alternate the output switch 150 between an open state and a closed state. Thus, the system 100 operates by alternating between: a first state in which the first set of switches are closed and the output switch 150 is open; and a second state in which the first set off switches are closed and the output switch 150 is closed.

During operation in the first state, the system 100 triggers: the output switch 150 to the open state; and the first set of switches in the closed state, thereby transferring energy generated by the first set of solar substrings 110 to a corresponding winding in the series of windings. Thus, the system 100: balances voltage differentials across the first set of solar substrings 110; and generates a set of magnetic fields across the series of windings during operation in the first state. Additionally, the system 100 can include a first set of capacitors: connected to the first set of solar substrings 110; and configured to store energy transferred from the first set of solar substrings 110 during operation in the first state.

During operation in the second state, the system 100 triggers: the output switch 150 to the closed state; and the first set of switches to the open state, thereby connecting the first series of windings and the solar substrings in series to each other. During the second state, the set of magnetic fields generated in the first state dissipate resulting in increased voltage output across the first series of windings and the first set of solar substrings 110. Thus, in the second state the system 100: generates a voltage output greater than a nominal output voltage across the first set of solar substrings 110; and charges the output capacitor 152 connected to the output switch 150.

In this implementation, the system 100 generates a gained output voltage defined by the ratio between time duration of the system 100 in the first state and time duration of the system 100 in the second state. The system 100 can manually and/or autonomously modify the gained output voltage, such as by modifying the duty cycle of the first modulation signal, modifying dead time between the first modulation signal and the second modulation signal, and modifying frequency of the first modulation signal and the second modulation signal. In one example, the system 100 can implement MPPT techniques to: autonomously modify the first modulation signal and the second modulation signal; and maintain a target voltage output during operation of the system 100.

In one example, the system 100: drives a first modulation signal to the first switch 134 in the first power level segment 130 and the second switch 144 in the second power level segment 140; drives a second modulation signal, inversely proportional to the first modulation signal, to the output switch 150 in the output power level segment; and alternates operation of the power conversion circuit 120 between a charging state and a discharging state.

More specifically, during the charging state, the system 100 can drive the first modulation signal to operate the first switch 134 and the second switch 144 in an active state to: direct a first current—generated from the first solar substring 112 operating at a first voltage—across the first winding 132 to generate a first magnetic field at the first winding 132; and direct a second current generated from the second solar substring 114 operating at a second voltage, different from the first voltage, across the second winding 142 to generate a second magnetic field at the second winding 142. Accordingly, the system 100 can induce balancing of the first operating voltage from the first solar substring 112 and the second operating voltage from the second solar substring 114 to the nominal output voltage across the first winding 132 and the second winding 142.

Additionally, during the charging state, the system 100 can drive the second modulation signal to operate the output switch 150 in an inactive state to block current from the first winding 132 and the second winding 142 directed to the output capacitor 152. Thus, during the charging state, the system 100 can: store energy (or "charge") in the first winding 132 and second winding 142 in the form of magnetic fields via electrical current received from the set of solar substrings; and simultaneously balance different voltages output from the first solar substring 112 and the second solar substring 114 across the first winding 132 and the second winding 142.

Furthermore, during the discharging state, the system 100 can drive the first modulation signal to operate the first switch 134 and the second switch 144 in an inactive state to block current—output from the first solar substring 112 and the second solar substring 114—directed across the first winding 132 and the second winding 142. Additionally, during the discharging state, the system 100 can drive the second modulation signal to operate the output switch 150 in an active state to: induce discharging of the first magnetic field across the first winding 132 to direct a first inductor current from the first winding 132 to the output capacitor 152; and induce discharging of the second magnetic field across the second winding 142 to direct a second inductor current from the second winding 142 to the output capacitor 152. Accordingly, the system 100 can then increase voltage across the output capacitor 152 toward the target voltage based on a combination of the first inductor current and the second inductor current.

Thus, during the discharging state, the system 100 can: release energy (or "discharge") in the first winding 132 and the second winding 142 in the form of electrical current directed to the output capacitor 152 in the output power level segment; and modify the nominal output voltage—output from the first set of solar substrings 110—to a target voltage output greater than the nominal output voltage.

Therefore, the system 100 can output and maintain a target voltage greater than a nominal output voltage from the set of substrings with a minimal component count and regardless of the environmental conditions affecting the first set of solar substrings 110.

4.2 Inductive Leakage

In one implementation, the system 100 can include a set of diodes: arranged in parallel to each other; connected to the first series of windings and the output capacitor 152; and configured to direct leakage inductance from the first series of windings to the output capacitor 152. In this implementation, during dead-time operation of the system 100 (i.e., the first set of switches and the output switch 150 are both in the open state), the set of diodes are configured to conduct in order to transfer energy stored as leakage inductance of the transformer to the output of the system 100.

More specifically, the second power level segment 140 can further include a first diode 154: arranged in series with the second switch 144 between the first winding 132 and the second winding 142; and configured to conduct current in a first direction toward the output capacitor 152. Accordingly, during the voltage modification cycle, the system 100 can then: direct a first leakage inductance current from the first winding 132 through the output switch 150 toward the output capacitor 152; and direct a second leakage inductance current from the second winding 142 through the first diode 154 toward the output capacitor 152. Thus, the output switch 150 and the first diode 154 cooperate to direct inductive leakage—from the first winding 132 and the second winding 142—toward the output capacitor 152 in order to recuperate energy loses resulting from charging and discharging of the magnetic fields across the first winding 132 and the second winding 142.

For example, the system 100 can include a set of diodes including a first diode 154: connected to the fourth junction between the first winding 132 and the second winding 142; connected to the output capacitor 152; and configured to conduct current in a first direction toward the output capacitor 152. Additionally, the system 100 includes the set of diodes including a second diode: arranged in parallel to the first diode 154; connected to the sixth junction between the second winding 142 and the third winding 172; connected to the output capacitor 152; and configured to conduct current in the first direction toward the output capacitor 152. Thus, the system 100 can transfer energy—in the form of leakage inductance—from the first series of windings toward the output of the system 100 in order to increase the output voltage from the system 100.

In another implementation, the system 100 can include a second set of switches (e.g., transistors, NMOS devices, PFET devices): arranged in parallel to each other; connected to the first series of windings and the output capacitor 152; arranged opposite to the first set of switches; and configured to direct leakage inductance from the first series of windings to the output capacitor 152. In this implementation, the system 100: drives the first modulation signal to the first set of switches and the second set of switches; and directs leakage inductance from the first series of windings to charge the output capacitor 152.

More specifically, the second power level segment 140 can further include a third switch 174: arranged in series with the second switch 144 between the first winding 132 and the second winding 142; configured to conduct current in a first direction toward the output capacitor 152; and configured to receive the first modulation signal from the controller 190. Accordingly, during the voltage modification cycle, the system 100 can: direct a first leakage inductance current from the first winding 132 through the output switch 150 toward the output capacitor 152; and direct a second leakage inductance current from the second winding 142 through the third switch 174 toward the output capacitor 152. Thus, the output switch 150 and the third switch 174 cooperate to direct inductive leakage—from the first winding 132 and the second winding 142—toward the output capacitor 152 in order to recuperate energy loses resulting from charging and discharging of the magnetic fields across the first winding 132 and the second winding 142.

For example, the system 100 can include a second set of switches including a fifth switch: connected to the fourth junction between the first winding 132 and the second winding 142; connected to the output capacitor 152; and configured to conduct current in a first direction toward the output capacitor 152. Additionally, the system 100 includes the second set of switches including a sixth switch: arranged in parallel to the fifth switch; connected to the sixth junction between the second winding 142 and the third winding 172; connected to the output capacitor 152; and configured to conduct current in the first direction toward the output capacitor 152. In this example, the system 100 delivers the first modulation signal to the first set of switches and the second set of switches. Thus, during deadtime operation (i.e., the first set of switches and the second set of switches are both in the open state) of the system 100, the fifth switch and the sixth switch conduct leakage inductance from the series of windings in order to conduct current toward the output of the system 100.

Therefore, the system 100 can transfer energy resulting from leakage inductance during modification (e.g., increase, attenuate) of balanced voltages from a series of solar substrings to an output voltage of the system 100.

4.3 Buck Configuration

In one implementation, the system 100 is arranged in a buck configuration to: balance voltage output across the first set of solar substrings 110; and decrease the nominal voltage output from the first set of solar substrings 110. In this implementation, the system 100 includes: a first series of windings arranged in series; a first series of solar substrings arranged in series and connected in parallel to the first series of windings; and a first set of switches (e.g., transistors) arranged in parallel to each other and connecting the first series of windings to the first series of solar substrings. Additionally, the system 100 includes: an output switch 150 connected in series to a first switch 134 in the first set of switches; and an output capacitor 152 connected to the output switch 150 and the series of windings.

As described above, the system 100 operates by alternating between: a first state in which the first set of switches are closed and the output switch 150 is open; and a second state in which the first set of switches are closed and the output switch 150 is closed. During operation in the first state, the system 100 triggers: the output switch 150 to the open state and the first set of switches in the closed state, thereby transferring energy generated form the first set of solar substrings 110 to a corresponding winding in the series of windings. Thus, the system 100: balances voltages across the first set of solar substrings 110; stores energy transferred from the first set of solar substrings 110 in the series of windings to generate an opposing voltage; and generates an output voltage less than a nominal output voltage from the first set of solar substrings no. Additionally, the system 100 can include a set of capacitors: connected to the first set of solar substrings 110; and configured to store energy transferred from the first set of solar substrings no during operation in the first state.

During operation in the second state, the system 100 triggers: the output switch 150 to the closed state; and the first set of switches to the open state, thereby disconnecting the first set of solar substrings no from the output of the system 100. Thus, in the second state, the system 100: generates a voltage drop across the series of windings; and transfers energy from the series of windings toward the output of the system 100. As described above, the system 100 can then implement MPPT techniques to: autonomously modify the first modulation signal and the second modulation signal; and maintain a target voltage output during operation of the system 100.

Additionally, as described above, the system 100 can incorporate a set of diodes and/or a second set of switches in order to transfer energy resulting from leakage inductance from the series of windings toward the output of the system 100 during deadtime operation of the system 100.

4.4 Boost/Buck Configuration

In one implementation, the system 100 is arranged in boost/buck configuration to: balance voltage output across the first set of solar substrings 110; and modify (e.g., increase, attenuate) the nominal voltage output from the first set of solar substrings 110. In this implementation, the system 100 includes: a first series of windings arranged in series; a first series of solar substrings arranged in series and connected in parallel to the first series of windings; and a first set of switches (e.g., transistors) arranged in parallel to each other and connecting the first series of windings to the first series of solar substrings. Additionally, the system 100 can include a first set of capacitors: connected to the first set of solar substrings 110; and configured to store energy transferred from the first set of solar substrings 110 during operation of the system 100.

Furthermore, the system 100 includes: a second set of capacitors arranged in series and in parallel to the series of windings; and a second set of switches. The second set of switches: are arranged in parallel to each other; are arranged opposite the first set of switches; and connect the second set of capacitors to the series of windings. In this implementation, the system 100 also includes: an output switch 150 connected in series to a first switch 134 in the first set of switches; and an output capacitor 152 connected to the output switch 150.

During operation, the system 100 can generate: a first modulation signal configured to alternate the first set of switches and the second set of switches between an open state and a closed state; and a second modulation signal— inversely proportional to the first modulation signal except during dead time—configured to alternate the output switch 150 between an open state and a closed state. Thus, the system 100 operates by alternating between: a first state (i.e., the first set of switches are closed and the second set of switches are open) and a second state (i.e., the first set of switches are open and the second set of switches are closed).

During operation in the first state, the system 100 triggers: the output switch 150 and the second set of switches to the open state; and the first set of switches to the closed state, thereby transferring energy generated by the first set of solar substrings no to a corresponding winding in the series of windings. Additionally, in the first state, the system 100 triggers the output capacitor 152 to discharge and direct current toward the output of the system 100. Thus, the system 100: balances voltage differentials across the first set of solar substrings 110; generates a set of magnetic fields across the series of windings to store energy from the series solar substrings; and supplies energy from the first set of solar substrings no to the second set of capacitors.

During operation in the second state, the system 100 triggers: the output switch 150 and the second set of switches to the closed state; and the first set of switches to the open state, thereby disconnecting the first set of solar substrings 110 from the series of windings in order to transfer energy in the series of windings toward the output of the system 100. Thus, the system 100: charges the second set of capacitors from the energy output from the series of windings; and transfers energy from the second set of capacitors toward the output load of the system 100.

In this implementation, the system 100 alternates between operation in the first state and the second state to generate a gained output voltage defined by –(duty cycle)/(1–duty cycle) different from the nominal voltage output from the first set of solar substrings 110. Thus, the system 100 can modify (e.g., increase, attenuate) voltage output from the first set of solar substrings 110 in order to maintain a constant voltage output to a target load regardless of environmental conditions affecting the first set of solar substrings 110.

Additionally, as described above, the system 100 implements the second set of switches to transfer energy resulting from leakage inductance from the series of windings toward the output of the system 100 during deadtime operation of the system 100.

4.4.1 Example: Boost/Buck+Signal Path

In one example, the system 100 includes: a first set of solar substrings 110 arranged in series; and a power conversion circuit 120 forming a boost/buck conversion circuit coupled to the first set of solar substrings no and configured to modify (e.g., increase, attenuate) a nominal output voltage from the first set of solar substrings 110.

In this example, the first set of solar substrings no includes a first solar substring 112 and a second solar substring 114 arranged in series. Additionally, the power conversion circuit 120 includes a first power level segment 130 including: a first winding 132 arranged in parallel to the first solar substring 112; a first switch 134 arranged between the first winding 132 and the first solar substring 112; and a first capacitor 160 arranged in parallel to the first winding 132. Additionally, the power conversion circuit 120 includes a second power level segment 140 including: a second winding 142 connected in series with the first winding 132 and arranged in parallel to the second solar substring 14; and a second switch 144 arranged in parallel to the first switch 134 between the second winding 142 and the second solar substring 114. Furthermore, the second power level segment 140 can also include: a second capacitor 162 arranged in series to the first capacitor 160 and in parallel to the second winding 142; and a third switch 174 arranged in series to the second switch 144 between the second capacitor 162 and the second winding 142.

In the aforementioned example, the power conversion circuit 120 also includes an output power level segment including: an output switch 150 arranged in series with the first switch 134; and an output capacitor 152 connected to the output switch 150 and configured to couple to a target load. Accordingly, the system 100 can then trigger a voltage modification cycle to alternate operation of the power conversion circuit 120 between a charging state and a discharging state by: driving a first modulation signal to the first switch 134, the second switch 144, and the third switch 174 at a first duty cycle; and driving a second modulation signal, inversely proportional to the first modulation signal, to the output switch 150. Thus, the system 100 can then: balance voltages output from the first solar substring 112 and the second solar substring 114 across the first winding 132 and the second winding 142 to a nominal output voltage; and modify the nominal output voltage to a target voltage directed to the target load based on the first duty cycle.

Therefore, the system 100 can: implement maximum power point tracking techniques to detect a power output from the first set of solar substrings 110 deviating from maximum power output; and modify (e.g., increase, attenuate) the nominal voltage output from the first set of solar substrings 110 to a target voltage output by driving the first modulation signal and the second modulation signal.

More specifically, during the charging state, the system 100 can drive the first modulation signal to operate the first switch 134, the second switch 144, and the third switch 174 in an active state to: direct a first current generated from the first solar substring 112 operating at a first voltage across the first winding 132 to generate a first magnetic field at the first winding 132; and direct a second current generated from the second solar substring 114 operating at a second voltage—different from the first voltage—across the second winding 142 to generate a second magnetic field at the second winding 142. Thus, the during the charging state, the system 100 can induce balancing of the first operating voltage from the first solar substring 112 and the second operating voltage from the second solar substring 114 to the nominal output voltage across the first winding 132 and the second winding 142. Additionally, during the charging state, the system 100 can drive the second modulation signal to operate the output switch 150 in an inactive state to: block current from the first winding 132 and the second winding 142 directed to the output capacitor 152; and direct electrical energy stored in the first capacitor 160 and the second capacitor 162 toward the target load.

Therefore, during the charging state, the system 100 can: balance voltage output from the first set of solar substrings 110 to a nominal voltage output across the first winding 132 and the second winding 142 regardless of environmental conditions; and transfer energy (e.g., electrical energy) stored in the first capacitor 160 and the second capacitor 162 toward the output capacitor 152 in the output power level segment.

Alternatively, during the discharging state, the system 100 can drive the first modulation signal to operate the first switch 134, the second switch 144, and the third switch 174 in an inactive state to: block current from the first solar substring 112 and the second solar substring 114 directed across the first winding 132 and the second winding 142; and direct current from the first winding 132 and the second winding 142 to charge the first capacitor 160 and the second capacitor 162. Furthermore, during the discharging state, the system 100 can drive the second modulation signal to operate the output switch 150 in an active state to: induce discharging of the first magnetic field across the first winding 132 to direct a first inductor current from the first winding 132 to the output capacitor 152; and induce discharging of the second magnetic field across the second winding 142 to direct a second inductor current from the second winding 142 to the output capacitor 152. Accordingly, the system 100 can then increase voltage across the output capacitor 152 toward the target voltage based on a combination of the first inductor current, the second inductor current, and the energy transferred to the first capacitor 160 and the second capacitor 162.

Therefore, during the discharging state, the system 100 can: modify (e.g., increase, attenuate) a nominal output voltage from the set of solar substrings to a target voltage output, such as corresponding to a maximum power point voltage; and induce charge in the first capacitor 160 and the second capacitor 162 via energy (e.g., inductive current) released from the first winding 132 and the second winding 142.

4.5 Variation

In one variation of the boost/buck configuration, the system 100 includes: a first series of windings arranged in series; a first series of solar substrings arranged in series and connected in parallel to the first series of windings; and a second series of solar substrings. The second series of solar substrings: are arranged in series; are arranged opposite the first series of solar substrings; and are connected in parallel to the first series of windings. Additionally, the system 100 includes: a first set of switches; and a second set of switches. The first set of switches: are arranged in parallel to each other; and connected between the first series of solar substrings and the series of windings. The second set of switches: are arranged in parallel to each other; arranged opposite the first set of switches; and connected between the second series of solar substrings and the series of windings. In this implementation, the system 100 can: deliver a first modulation signal to the first set of switches; and deliver a second modulation signal—inversely proportional to the first modulation signal—to the second set of switches.

In this variation, during the balancing cycle, the system 100 alternates between: balancing voltage output from the first set of solar substrings 110 to a first nominal voltage output across the first winding 132 and the second winding 142; and balancing voltage output from the second set of solar substrings 116 to a second nominal voltage output across the first winding 132 and the second winding 142. Thus, the system 100 can: direct current from the first set of solar substrings 110 and the second set of solar substrings 116 across the first winding 132 and the second winding 142 to store energy in the form of magnetic fields; and discharge the magnetic fields across the first winding 132 and the second winding 142 to modify (e.g., increase, attenuate) the nominal output voltage to the target output voltage.

For example, the system 100 can include a second set of solar substrings 116 including a third solar substring 118 and a fourth solar substring 119: arranged in series; and arranged in parallel to the first set of solar substrings 110. In this example, the first power level segment 130 further includes the third solar substring 118 arranged parallel to the first winding 132 and opposite the first solar substring 112. Additionally, the second power level segment 140 can include: the fourth solar substring 119 arranged parallel to the second winding 142 and opposite the second solar substring 114; and a third switch 174 coupled to the output capacitor 152. The third switch 174 is: arranged in series with the second switch 144 between the fourth solar substring 119 and the second winding 142; and configured to receive the second modulation signal from the controller 190. Accordingly, during the voltage modification cycle, the system 100 can: balance voltages output from the third solar substring 118 and the fourth solar substring 119 across the first winding 132 and the second winding 142 to a second nominal output voltage; and modify the second nominal output voltage to a second target voltage directed to the target load output based to the first duty cycle.

Thus, as described above, the system 100 can alternate between a first state and a second state in order to: modify (e.g., increase, attenuate) a voltage output from the first series of solar substrings and the second series of solar substrings; and maintain a target output voltage to a target load regardless of environmental conditions affecting the first series of solar substrings and the second series of solar substrings.

5. Maintaining Target Voltage Output

Generally, the system 100 can implement maximum power point tracking (MPPT) techniques (e.g., perturb and observe, incremental conductance, current sweep, constant voltage) to interpret deviations of a nominal output voltage from a target voltage output corresponding to a maximum power output for the first set of solar substrings 110. Accordingly, the system 100 can: read a nominal output voltage from the first set of solar substrings 110; interpret the nominal output voltage deviating (e.g., greater than, less than) from the target voltage output corresponding to a maximum power output for the first set of solar substrings 110; and, in response to the nominal output voltage deviating from the target voltage output, initiating the voltage modification cycle to modify the nominal output voltage by alternating states of the power conversion circuit 120 between the charging state and the discharging state. In one example, during the voltage modification cycle, the system 100 can: drive the first modulation signal to the first switch 134 and the second switch 144 at a 50-percent duty cycle; and drive the second modulation signal, inversely proportional to the first modulation signal at the 50-percent duty cycle, to the output switch 150.

5.1. Maximum Power Point Tracking

In one implementation, the system 100 initiates a set-up period prior to triggering the voltage modification cycle to: interpret an operating voltage for the first set of solar substrings 110 corresponding to a maximum power output for the first set of solar substrings 110; and store the interpreted operating voltage as the target voltage for the power conversion circuit 120. Thus, following the set-up period, the system 100 can: read a nominal operating voltage from the first set of solar substrings 110, such as from a voltage sensor coupled to the first set of solar substrings 110; and, in response to the nominal operating voltage deviating from the target voltage, initiate the voltage modification cycle to modify the nominal operating voltage to the target voltage.

In one example, during a set-up period, the system 100 can: read a first sequence of voltage values from a voltage sensor coupled to the first set of solar substrings 110; interpret an output voltage corresponding to maximum power output of the first set of solar substrings 110 based on the first sequence of voltage values; and store the output voltage corresponding to the maximum power output as the target voltage. Furthermore, during a first time following the set-up period, the system 100 can read a first voltage from the voltage sensor coupled to the first set of solar substrings 110; and interpret the first voltage deviating from the target voltage. Accordingly, in response to the first voltage deviating from the target voltage, the system 100 can trigger the voltage modification cycle to: alternate operation of the power conversion circuit 120 between a charging state and a discharging state; and modify the first voltage to the target voltage corresponding to the maximum power output of the first set of solar substrings 110.

Therefore, the system 100 can implement maximum power point tracking (MPPT) techniques to maintain a target output (e.g., voltage, current, power) delivered toward the target load coupled to the power conversion circuit 120.

5.2 Temperature Maximum Power Point Tracking

In another implementation, during a set-up period, the system 100 can: read a timeseries of temperature values from a temperature sensor coupled to the first set of solar substrings 110; interpret a first temperature value (e.g., Fahrenheit, Celsius) corresponding to a maximum power output for the first set of solar substrings no based on the timeseries of solar substrings; and store the first temperature value as a target temperature value for the first set of solar substrings no during operation of the system 100. Accordingly, during an initial time period following the set-up period, the system 100 can: read a first temperature value from the temperature sensor coupled to the first set of solar substrings 110; and, in response to the first temperature value deviating from a target temperature value, trigger the voltage modification cycle to alternate operation of the power conversion circuit 120 between a charging state and a discharging state.

6.0 Battery Cell Balancing

Generally, the system 100 can: include a rechargeable battery 164 coupled to the power conversion circuit 120 and configured to direct stored energy (i.e., in the rechargeable battery 164) towards the target load; and implement battery regulation techniques (e.g., passive, active) to balance battery cells contained in the rechargeable battery 164 while maintaining a target voltage output to the target load.

In one implementation, the system 100 can: integrate the rechargeable battery 164 within the power conversion circuit 120; read a stored energy potential (e.g., voltage) in the rechargeable battery 164 supplied to the target load; and, in response to the stored energy potential falling below a threshold energy potential, trigger the voltage balancing cycle at the power conversion circuit 120 to restore charge to battery cells contained in the rechargeable battery 164 and deliver the target voltage to the target load. Thus, the system 100 can routinely initiate the voltage modification cycle to supply electrical charge to the rechargeable battery 164 while inducing balancing (e.g., passive balancing) of solar cells contained in the rechargeable battery 164 to extend shelf-life of the rechargeable battery 164 directing energy to a target load (e.g., mobile device, optical sensor).

For example, the rechargeable battery 164 can include: a first battery cell 166 storing a first battery cell voltage; and a second battery cell 168 arranged in series to the first battery cell 166 and storing a second battery cell voltage different from the first battery cell voltage. In this example, the first power level segment 130 can further include: a first capacitor 160 arranged in parallel to the first winding 132; and the first battery cell 166 arranged in parallel to the first capacitor 160 and configured to shunt excess energy contained within the first battery cell 166 through the first capacitor 160. Additionally, the second power level segment 140 can include a second capacitor 162 and a third switch 174. The second capacitor 162 is arranged: in series with the first capacitor 160; and arranged in parallel to the second winding 142. The third switch 174 is: arranged in series with the second switch 144 between the second capacitor 162 and the second winding 142; and configured to receive the first modulation signal from the controller 190. Furthermore, the second power level segment 140 includes the second battery cell 168: arranged in parallel to the second capacitor 162; and configured to shunt excess energy contained in the second battery cell 168 through the second capacitor 162.

Accordingly, in response to illumination of the first set of solar substrings 110, the system 100 can: induce charging of the first battery cell 166 and the second battery cell 168 from electrical energy generated at the first set of solar substrings 110; and induce passive balancing to shunt excess energy from the first battery cell 166 containing a higher state of charge to the second battery cell 168. Therefore, during the voltage modification cycle, the system 100 can: direct current generated from the first set of solar substrings 110 toward the first battery cell 166 and the second battery cell 168 to supply electrical energy to the rechargeable battery 164; and balance the first battery cell voltage and the second battery cell voltage to a nominal battery cell voltage.

In another implementation, during a first time period, the system 100 can: calculate a duty cycle as a ratio between voltage output from the rechargeable battery 164 and the voltage output from the first set of solar substrings 110; and implement this duty cycle during the voltage modification cycle to supply charge to the rechargeable battery 164 and balance battery cells in the rechargeable battery 164. For example, prior to initiating the voltage modification cycle, the system 100 can: read a first voltage output from a first voltage sensor coupled to the rechargeable battery 164; read a second voltage output from a second voltage sensor coupled to the first set of solar substrings 110; calculate a first ratio between the first voltage output from the rechargeable battery 164 and the second voltage output from the first set of solar substrings 110; and store the first ratio as the first duty cycle for the first modulation signal directed to the first switch 134, the second switch 144, and the third switch 174.

Therefore, the system 100 can: routinely calculate a duty cycle as a ratio between the voltage output from the rechargeable battery 164 and the voltage output from the first set of solar substrings 110; and initiate the voltage modification cycle at the duty cycle to induce charging of the rechargeable battery 164 from energy output from the first set of solar substrings 110.

6.1 Examples

In one example, the system 100 includes: an electronic device such as, an optical sensor, radio transceivers, and light emitters; a solar panel including a first set of solar substrings 110; and a rechargeable battery 164 including a set of battery cells and configured to supply electrical energy to the electronic device. In this example, the system 100 further includes the power conversion circuit 120 coupled to the solar panel and the rechargeable battery 164 and is configured to: maintain a target voltage output from the first set of solar substrings 110; direct the target voltage output from the first set of solar substrings to the rechargeable battery 164 supply charge to the set of battery cells; and, balance the set of battery cells in the rechargeable battery 164 during the voltage modification cycle.

In this example, during a first operating period, the system 100 can: read a state of charge (e.g., stored voltage) from the rechargeable battery 164; and, in response to state of charge falling below a threshold state of charge, initiate the voltage modification cycle to induce charging and balancing of the set of battery cells in the rechargeable battery 164. In another example, during a first operating period, the system 100 can: read electrical value (e.g., current, voltage) from the first set of solar substrings 110; and, in response to interpreting an illumination condition for the first solar substring based on the electrical value, initiate the voltage modification cycle to induce charging and balancing of the set of battery cells in the rechargeable battery 164.

Therefore, the system 100 can maintain the electronic device in an operating period by routinely triggering voltage modification cycles at the power conversion circuit 120 to induce balancing (e.g., passive balancing) and charging of the rechargeable battery 164 coupled to the electronic device.

The systems and methods described herein can be embodied and/or implemented at least in part as a machine configured to receive a computer-readable medium storing computer-readable instructions. The instructions can be executed by computer-executable components integrated with the application, applet, host, server, network, website, communication service, communication interface, hardware/firmware/software elements of a user computer or mobile device, wristband, smartphone, or any suitable combination thereof. Other systems and methods of the embodiment can be embodied and/or implemented at least in part as a machine configured to receive a computer-readable medium storing computer-readable instructions. The instructions can be executed by computer-executable components integrated by computer-executable components integrated with apparatuses and networks of the type described above. The computer-readable medium can be stored on any suitable computer readable media such as RAMs, ROMs, flash memory, EEPROMs, optical devices (CD or DVD), hard drives, floppy drives, or any suitable device. The computer-executable component can be a processor but any suitable dedicated hardware device can (alternatively or additionally) execute the instructions.

As a person skilled in the art will recognize from the previous detailed description and from the figures and claims, modifications and changes can be made to the embodiments of the invention without departing from the scope of this invention as defined in the following claims.

I claim:

1. A system for balancing and converting voltage output from photovoltaic modules comprising:
   a first set of solar substrings comprising a first solar substring and a second solar substring arranged in series;
   a power conversion circuit comprising:
      a first power level segment comprising:
         a first winding arranged in parallel to the first solar substring; and
         a first switch arranged between the first winding and the first solar substring;
      a second power level segment comprising:
         a second winding connected in series with the first winding and arranged in parallel to the second solar substring; and
         a second switch arranged in parallel to the first switch between the second winding and the second solar substring; and
      an output power level segment comprising:
         an output switch arranged in series with the first switch; and
         an output capacitor connected to the output switch and configured to couple to a target load; and
   a controller configured to:
      trigger a voltage modification cycle to alternate operation of the power conversion circuit between a charging state and a discharging state by:
         driving a first modulation signal to the first switch and the second switch at a first duty cycle; and
         driving a second modulation signal, inversely proportional to the first modulation signal, to the output switch;
      balance voltages output from the first solar substring and the second solar substring across the first winding and the second winding to a nominal output voltage; and
      modify the nominal output voltage to a target voltage directed to the target load based on the first duty cycle.

2. The system of claim 1, wherein the controller is configured to, in the charging state:

drive the first modulation signal to operate the first switch and the second switch in an active state to:
  direct a first current from the first solar substring operating at a first voltage across the first winding to generate a first magnetic field at the first winding;
  direct a second current from the second solar substring operating at a second voltage, different from the first voltage, across the second winding to generate a second magnetic field at the second winding; and
  induce balancing of the first operating voltage from the first solar substring and the second operating voltage from the second solar substring to the nominal output voltage across the first winding and the second winding; and
drive the second modulation signal to operate the output switch in an inactive state to block current from the first winding and the second winding directed to the output capacitor.

3. The system of claim 1, wherein the controller is configured to, in the discharging state:
drive the first modulation signal to operate the first switch and the second switch in an inactive state to block current from the first solar substring and the second solar substring directed across the first winding and the second winding; and
drive the second modulation signal to operate the output switch in an active state to:
  induce discharging of the first magnetic field across the first winding to direct a first inductor current from the first winding to the output capacitor;
  induce discharging of the second magnetic field across the second winding to direct a second inductor current from the second winding to the output capacitor; and
  increase voltage across the output capacitor toward the target voltage based on a combination of the first inductor current and the second inductor current.

4. The system of claim 1, wherein the controller is configured to:
during a first time period:
  read a first sequence of voltage values from a voltage sensor coupled to the first set of solar substrings;
  determine an output voltage corresponding to maximum power output of the first set of solar substrings based on the first sequence of voltage values; and
  store the output voltage corresponding to the maximum power output as the target voltage; and
during a second time period following the first time period:
  read a first voltage from the voltage sensor coupled to the first set of solar substrings; and
  in response to the first voltage deviating from the target voltage, trigger the voltage modification cycle to:
    alternate operation of the power conversion circuit between a charging state and a discharging state; and
    modify the first voltage to the target voltage corresponding to the maximum power output of the first set of solar substrings.

5. The system of claim 1, wherein the controller is configured to:
read a first temperature value from a temperature sensor coupled to the first set of solar substrings; and
in response to the first temperature value deviating from a target temperature value, trigger the voltage modification cycle to alternate operation of the power conversion circuit between a charging state and a discharging state.

6. The system of claim 1:
wherein the second power level segment further comprises a first diode:
  arranged in series with the second switch between the first winding and the second winding; and
  configured to conduct current in a first direction toward the output capacitor; and
wherein the controller is configured to, during the voltage modification cycle:
  direct a first leakage inductance current from the first winding through the output switch toward the output capacitor; and
  direct a second leakage inductance current from the second winding through the first diode toward the output capacitor.

7. The system of claim 1:
wherein the second power level segment further comprises a third switch:
  arranged in series with the second switch between the first winding and the second winding;
  configured to conduct current in a first direction toward the output capacitor; and
  configured to receive the first modulation signal from the controller; and
wherein the controller is configured to, during the voltage modification cycle:
  direct a first leakage inductance current from the first winding through the output switch toward the output capacitor; and
  direct a second leakage inductance current from the second winding through the third switch toward the output capacitor.

8. The system of claim 1:
wherein the first power level segment further comprises a first capacitor arranged in parallel to the first winding;
wherein the second power level segment further comprises:
  a second capacitor:
    arranged in series with the first capacitor; and
    arranged in parallel to the second winding; and
  a third switch:
    arranged in series with the second switch between the second capacitor and the second winding; and
    configured to receive the first modulation signal from the controller; and
wherein the controller is configured to, during the voltage modification cycle:
  charge the first capacitor and the second capacitor by directing current from the first set of solar substrings toward the first capacitor and the second capacitor; and
  supply energy within the first capacitor and the second capacitor toward the output capacitor coupled to the target load.

9. The system of claim 1:
further comprising a rechargeable battery:
directing energy to the target load;
  connected to the power conversion circuit; and
  comprising:
    a first battery cell storing a first battery cell voltage; and
    a second battery cell arranged in series to the first battery cell and storing a second battery cell voltage different from the first battery cell voltage;

wherein the first power level segment further comprises:
a first capacitor arranged in parallel to the first winding; and
the first battery cell arranged in parallel to the first capacitor;
wherein the second power level segment further comprises:
a second capacitor:
arranged in series with the first capacitor; and
arranged in parallel to the second winding;
a third switch:
arranged in series with the second switch between the second capacitor and the second winding; and
configured to receive the first modulation signal from the controller; and
the second battery cell arranged in parallel to the second capacitor; and
wherein the controller is configured to, during the voltage modification cycle:
direct current from the first set of solar substrings toward the first battery cell and the second battery cell to supply electrical energy to the rechargeable battery; and
balance the first battery cell voltage and the second battery cell voltage to a nominal battery cell voltage.

10. The system of claim 9, wherein the controller is configured to:
read a first voltage output from a first voltage sensor coupled to the rechargeable battery;
read a second voltage output from a second voltage sensor coupled to the first set of solar substrings;
calculate a first ratio between the first voltage output from the rechargeable battery and the second voltage output from the first set of solar substrings; and
store the first ratio as the first duty cycle for the first modulation signal directed to the first switch, the second switch, and the third switch.

11. The system of claim 1:
wherein the first switch comprises a first transistor comprising:
a first source coupled to a first junction connected to:
a ground rail; and
the first solar substring;
a first drain coupled to a second junction connected to the first winding; and
a first gate coupled to a first control output of the controller and configured to receive the first modulation signal;
wherein the second switch comprises a second transistor comprising:
a second source coupled to a third junction:
connected to the ground rail; and
interposed between the first solar substring and the second solar substring;
a second drain coupled to a fourth junction interposed between the first winding and the second winding; and
a second gate coupled to the first control output of the controller and configured to receive the first modulation signal; and
wherein the output switch comprises a third transistor comprising:
a third source coupled to the second junction connected to the first drain of the first transistor and the first winding:
a third drain coupled to the output capacitor; and
a third gate connected to a second control output of the controller and configured to receive the second modulation signal.

12. The system of claim 1:
wherein the first set of solar substrings further comprises a third solar substring arranged in series with the first solar substring and the second solar substring;
further comprising a third power level segment comprising:
a third winding connected in series with the second winding and arranged in parallel to the third solar substring; and
a third switch:
arranged in parallel to the second switch between the third winding and the third solar substring; and
configured to receive the first modulation signal from the controller; and
wherein the controller is configured to, during the voltage modification cycle:
balance voltages from the first solar substring, the second solar substring, and the third solar substring across the first winding, the second winding, and the third winding to the nominal output voltage; and
modify the nominal output voltage to the target voltage directed to the target load based on the first duty cycle.

13. The system of claim 1:
further comprising a second set of solar substrings:
comprising a third solar substring and a fourth solar substring arranged in series; and
arranged in parallel to the first set of solar substrings;
wherein the first power level segment further comprises the third solar substring arranged parallel to the first winding and opposite the first solar substring;
wherein the second power level segment further comprises:
the fourth solar substring arranged parallel to the second winding and opposite the second solar substring; and
a third switch:
arranged in series with the second switch between the fourth solar substring and the second winding; and
configured to receive the second modulation signal from the controller; and
wherein the controller is configured to, during the voltage modification cycle:
balance voltages output from the third solar substring and the fourth solar substring across the first winding and the second winding to a second nominal output voltage; and
modify the second nominal output voltage to a second target voltage directed to the target load output based to the first duty cycle.

14. The system of claim 1, wherein the power conversion circuit further comprises a transformer comprising the first winding and the second winding, the first winding defining a one-to-one ratio to the second winding in the transformer.

15. The system of claim 1, wherein the controller is configured to:
drive the first modulation signal to the first switch and the second switch at a 50-percent duty cycle; and
drive the second modulation signal, inversely proportional to the first modulation signal at the 50-percent duty cycle, to the output switch.

16. A system for balancing and converting voltage output from photovoltaic modules comprising:

a first set of solar substrings comprising a first solar substring and a second solar substring arranged in series;
a power conversion circuit comprising:
  a first power level segment comprising:
    a first winding arranged in parallel to the first solar substring;
    a first switch arranged between the first winding and the first solar substring; and
    a first capacitor arranged in parallel to the first winding;
  a second power level segment comprising:
    a second winding connected in series with the first winding and arranged in parallel to the second solar substring;
    a second switch arranged in parallel to the first switch between the second winding and the second solar substring;
    a second capacitor arranged in series to the first capacitor and in parallel to the second winding; and
    a third switch arranged in series to the second switch between the second capacitor and the second winding; and
  an output power level segment comprising:
    an output switch arranged in series with the first switch; and
    an output capacitor connected to the output switch and configured to couple to a target load; and
a controller configured to:
  trigger a voltage modification cycle to alternate operation of the power conversion circuit between a charging state and a discharging state by:
    driving a first modulation signal to the first switch, the second switch, and the third switch at a first duty cycle; and
    driving a second modulation signal, inversely proportional to the first modulation signal, to the output switch;
  balance voltages output from the first solar substring and the second solar substring across the first winding and the second winding to a nominal output voltage; and
  modify the nominal output voltage to a target voltage directed to the target load based on the first duty cycle.

17. The system of claim 16, wherein the controller is configured to:
drive the first modulation signal to operate the first switch, the second switch, and the third switch in an active state to:
  direct a first current from the first solar substring operating at a first voltage across the first winding to generate a first magnetic field at the first winding;
  direct a second current from the second solar substring operating at a second voltage, different from the first voltage, across the second winding to generate a second magnetic field at the second winding; and
  induce balancing of the first operating voltage from the first solar substring and the second operating voltage from the second solar substring to the nominal output voltage across the first winding and the second winding; and
drive the second modulation signal to operate the output switch in an inactive state to:
  block current from the first winding and the second winding directed to the output capacitor; and
  direct electrical energy stored in the first capacitor and the second capacitor toward the target load.

18. The system of claim 16, wherein the controller is configured to:
drive the first modulation signal to operate the first switch, the second switch, and the third switch in an inactive state to:
  block current from the first solar substring and the second solar substring directed across the first winding and the second winding; and
  direct current from the first winding and the second winding to charge the first capacitor and the second capacitor; and
drive the second modulation signal to operate the output switch in an active state to:
  induce discharging of the first magnetic field across the first winding to direct a first inductor current from the first winding to the output capacitor;
  induce discharging of the second magnetic field across the second winding to direct a second inductor current from the second winding to the output capacitor; and
  increase voltage across the output capacitor toward the target voltage based on a combination of the first inductor current and the second inductor current.

19. The system of claim 16:
further comprising a rechargeable battery coupled to the power conversion circuit and comprising a first battery cell and a second battery cell arranged in series;
wherein the first power level segment further comprises the first battery cell:
  storing a first battery cell voltage; and
  arranged in parallel to the first capacitor;
wherein the second power level segment further comprises the second battery cell:
  storing a second battery cell voltage different from the first battery cell voltage; and
  arranged in parallel to the second capacitor; and
wherein the controller is configured to, during the voltage modification cycle:
  direct current from the first set of solar substrings toward the first battery cell and the second battery cell to supply electrical energy to the rechargeable battery; and
  balance the first battery cell voltage and the second battery cell voltage to a nominal battery cell voltage.

20. A system for balancing and converting voltage output from photovoltaic modules comprising:
a set of solar substrings comprising a first solar substring and a second solar substring arranged in series;
a power conversion circuit comprising;
  a first set of windings coupled in series and arranged in parallel to the set of solar substrings;
  a first set of switches coupled in parallel and interposed between the set of solar substrings and the first set of windings;
  an output switch coupled in series to a first switch in the set of switches; and
  an output capacitor connected to the output switch and configured to couple to a target load; and
a controller configured to:
  oscillate states of the first set of switches and the output switch at a first duty cycle;
  balance voltages output from the set of solar substrings across the first set of windings to a nominal output voltage; and modify the nominal output voltage to a target voltage directed to the target load based on the first duty cycle.

* * * * *